United States Patent [19]

Batchelder et al.

[11] Patent Number: 5,316,970
[45] Date of Patent: May 31, 1994

[54] GENERATION OF IONIZED AIR FOR SEMICONDUCTOR CHIPS

[75] Inventors: John S. Batchelder, Tarrytown, N.Y.; Vaughn P. Gross, St. Albans; Robert A. Gruver, Essex Junction, both of Vt.; Philip C. D. Hobbs, Ossining, N.Y.; Kenneth D. Murray, Huntington, Vt.

[73] Assignee: International Business Machines Corporation, Armonk, N.Y.

[21] Appl. No.: 895,181

[22] Filed: Jun. 5, 1992

Related U.S. Application Data

[63] Continuation of Ser. No. 571,805, Aug. 23, 1990, abandoned.

[51] Int. Cl.$^5$ ............................................. H05F 3/06
[52] U.S. Cl. .................................. 437/173; 361/213; 250/424; 250/423 P
[58] Field of Search ................... 361/213; 250/423 R, 250/424, 423 P; 437/173

[56] References Cited

U.S. PATENT DOCUMENTS

| | | |
|---|---|---|
| 2,881,335 | 4/1959 | Vonnegut . |
| 3,210,007 | 10/1965 | Doyle . |
| 3,397,631 | 8/1968 | Simons . |
| 3,403,252 | 9/1968 | Nagy . |
| 3,443,087 | 5/1969 | Robieux . |
| 3,512,173 | 5/1970 | Damouth . |
| 3,719,829 | 3/1973 | Vaill ................................. 307/149 |
| 3,757,491 | 9/1973 | Gourdine . |
| 3,761,941 | 9/1973 | Robertson . |
| 3,790,079 | 2/1974 | Berglund . |
| 3,914,655 | 10/1975 | Dreyfus . |
| 3,923,482 | 12/1975 | Knab . |
| 4,017,767 | 4/1977 | Ball . |
| 4,025,790 | 5/1977 | Jetter . |
| 4,166,219 | 8/1979 | Ausschnitt . |
| 4,199,685 | 4/1980 | Hora . |
| 4,296,322 | 10/1981 | Wechsung . |
| 4,304,124 | 12/1981 | Biblarz . |
| 4,365,157 | 12/1982 | Unsold . |
| 4,376,637 | 3/1983 | Yang . |
| 4,383,171 | 5/1983 | Sinha . |
| 4,477,263 | 10/1984 | Shaver . |
| 4,528,612 | 7/1985 | Spengler . |
| 4,602,921 | 7/1986 | Shinohara . |
| 4,630,167 | 12/1986 | Huggins ........................... 361/213 |

(List continued on next page.)

FOREIGN PATENT DOCUMENTS

| | | | |
|---|---|---|---|
| 52-66884 | 6/1977 | Japan ................................. | 437/173 |
| 60-226130 | 11/1985 | Japan ................................. | 437/173 |

OTHER PUBLICATIONS

Smith et al., "Aerosol-Induced Air Breakdown With $CO_2$ Laser Radiation", Journal of Applied Physics, vol. 46, No. 3, Mar. 1975, pp. 1146-1153.

Kroll et al., "Theoretical Study of Ionization of Air by Intense Laser Pulses", Physical Review, A General Physics, vol. 5, No. 4, Apr. 1972, pp. 1883-1905.

(List continued on next page.)

Primary Examiner—Olik Chaudhuri
Assistant Examiner—Ourmazd S. Ojan
Attorney, Agent, or Firm—Perman & Green

[57] ABSTRACT

Ionization of air without the use of corona discharge tips, thereby to avoid the generation of particulates from corrosion of the corona tips, is accomplished by use of a laser beam focussed to a small focal volume of intense electric field adjacent a semiconductor chip. The electric field is sufficiently intense to ionize air. In the manufacture of a semiconductor circuit chip, during those steps which are conducted in an air environment, opportunity exists to remove from a surface of a chip, or wafer, charge acquired during the manufacturing process. The ionized air is passed along the chip surface. Ions in the air discharge local regions of the chip surface which have become charged by steps of a manufacturing process. By way of further embodiment of the invention, the ionization may be produced by injection of molecules of water into the air, which molecules are subsequently ionized by a laser beam and directed toward the chip via a light shield with the aid of a magnetic field.

16 Claims, 2 Drawing Sheets

U.S. PATENT DOCUMENTS

| | | | |
|---|---|---|---|
| 4,635,161 | 1/1987 | Le Vantine | 361/213 |
| 4,643,744 | 2/1987 | Brooks . | |
| 4,654,183 | 3/1987 | Hershcovitch . | |
| 4,664,938 | 5/1987 | Walker . | |
| 4,716,491 | 12/1987 | Ohno . | |
| 4,746,799 | 5/1988 | McMillan . | |
| 4,776,515 | 10/1988 | Michalchik . | |
| 4,809,127 | 2/1989 | Steinman et al. | 361/213 |
| 4,827,371 | 5/1989 | Yost | 361/213 |
| 4,829,398 | 5/1989 | Wilson | 361/213 |
| 4,838,150 | 6/1989 | Suzuki . | |
| 4,878,149 | 10/1989 | Stiehl . | |
| 4,994,715 | 2/1991 | Asmus et al. . | |
| 5,047,892 | 9/1991 | Sakata et al. | 361/213 |
| 5,057,966 | 10/1991 | Sakata et al. | 361/213 |
| 5,114,740 | 5/1992 | Plate et al. | 427/533 |
| 5,175,664 | 12/1992 | Diels et al. | 361/213 |

FOREIGN PATENT DOCUMENTS

Brown et al., "Laser-Induced Gas Breakdown in the Presence of Preionization", Applied Physics Letter, vol. 22, No. 5, Mar. 1, 1973, pp. 245–247.

Suzuki, et al "Effectiveness of Air Ionization Systems in Clean Rooms", 1988 Proceedings-Institute of Environmental Sciences pp. 405–412.

GENERATION OF IONIZED AIR FOR SEMICONDUCTOR CHIPS

This is a continuation of copending application Ser. No. 07/571,805 filed on Aug. 23, 1990, now abandoned.

BACKGROUND OF THE INVENTION

This invention relates to the generation of ionized air for removal of charges resident on surfaces of semiconductor chips during their manufacture and, more particularly, to the use of a sharply focused intense laser beam to ionize air in the vicinity of a semiconductor chip for discharging a surface of the chip.

During the construction of semiconductor chips having electrical circuitry thereon, the construction process entails the deposition and etching of materials as a succession of layers are built up on a surface of the chip substrate. The succession of layers must be kept free of contaminants to ensure proper operation of the chip circuitry. A primary source of contamination is the presence of particulates carried by air in the presence of the semiconductor chips. The particulates are found even in clean rooms employed for the manufacture of semiconductor chips. Typically, the clean room is provided with high efficiency filters (known as HEPA filters) for removal of airborne particles from incoming air. However, particulates are still found in clean rooms. Particulates generated in clean rooms are charged, generally. Also, charges develop upon semiconductor surfaces during the manufacture of the chips. The charges on the chip surfaces produce electric fields which create a strong attraction between the airborne particles and the corresponding oppositely charged semiconductor surfaces. This phenomenon is the primary cause for the anomalously large deposition rates of particulates of small particle size found in chip manufacture.

A technique that has been employed to reduce the foregoing attraction of particulates is to neutralize surfaces of the chip and of the various layers present in the manufacturing process, as well as to neutralize surfaces of tools employed in the manufacturing assembly line, by adding air ions to the output air stream from the foregoing filters. The technique of neutralization employs the passage of ionized air over the semiconductor surfaces. For example, typical electric fields produced by ungrounded wafers or containers are a few hundred to a few thousand volts per centimeter. The deposition rate for particles of class 100 air (100 particles per cubic foot of air) is approximately 100 times lower for environments that incorporate air ionization than for environments that do not employ the ionization. This is attributed to the neutralization effect of charges in the ionized air upon excess surface charges on the semiconductor chips. The discussion of the particle deposition rate in ionized air is presented in an article entitled "Equivalence Between Surface Contamination Rates And Class 100 Conditions" by R. Welker, 1988 Proceedings of the Institute of Environmental Sciences, Pages 449–454.

The presence of charges on the semiconductor surface presents an apparent danger to the minute circuit elements present on the chip. A charged region on the surface of a wafer attracts small dust particles out of the air which adhere to the surface and create imperfections within the chip structure during development of subsequent layers of material in the construction of the chip circuit. Due to the doping of semiconductor materials, such a silicon substrate used in the manufacture of a wafer, by way of example, from the point of view of static electricity, the surface of the wafer has sufficient conductivity to be regarded as an equipotential surface. Contact of the semiconductor surface with an electrically conductive medium may result in a sudden discharge current flowing at a point on the semiconductor surface. Frequently, the magnitude of such current is sufficient to damage or burn out elements of the chip circuit. The voltage, relative to a ground, resulting from triboelectricity may be very large; for example, the voltage resulting from ordinary handling of the wafer during manufacture may be as high as thirty kilovolts. It is also noted that the dust particles in the air are so small as to be carried about in the air by Brownian motion; gravity has little effect on such small particles and has little effect in inducing a settling of these particles on surfaces of the chip or tools used in fabricating the chip. Settling of the particles is accomplished by way of electrostatic forces which attract the particles to surfaces of the chip and the tools. Some of the dust particles arise from materials which may be employed in the chip manufacture.

By way of example, a plastic wafer boat holding a set of wafers might be impregnated with carbon particles to introduce electrical conductivity to the boat for grounding the wafers and reducing surface charges. However, the presence of the carbon would be a source of carbon dust. Thus, the introduction of ionized molecules in the air, such as an ionized oxygen molecule, is most useful in removal of the surface charges without acting as a source of further contaminating dust particles. The ionization process produces both positive and negative ions so as to be capable of neutralizing both negatively and positively charged regions on a surface of the chip. The ionization of the air may be viewed as introducing an electrical conductivity which bleeds off charge from the wafer, as by grounding.

Use of the corona tips for ionizing air introduces particulates, such as sputtered metal, and ions which are carried by the air to impinge upon chip surfaces. Ammonium nitrate may precipitate on the points and, thereafter, separate from the points as dust particles. The generation of ionized air by corona tips located distant from the wafer surface loses its effectiveness in confined spaces, as in a wafer stepper employed for photolithography, because the physical shapes of elements of the stepper introduce turbulence to air flow within the stepper. The turbulence encourages combination of positive and negative ions and, therefore, precludes the transport of balanced ionized air to the wafer surface from a distant source of ions.

A problem with the introduction of ionized air, wherein the ionization is produced by use of corona discharge to produce the ionization, is that the ionized air itself introduces considerable particulate contamination due to the corrosion of electrode tips used in the corona discharges. This is disclosed in an article entitled "Effectiveness Of Air Ionization In Clean Rooms" by M. Suzuki, I. Matshuhasi, and I. Izumoto, 1988 Proceedings of the Institute of Environmental Sciences, Pages 405–412. Generally, the corona discharge results in a negligible amount of particles generated in typical clean-room systems in the 0.1 to 1.0 micron range; a substantial amount of particles of smaller size is produced. The production rates of the smaller particles having diameters in the range of 0.03 to 0.1 microns are between 100 and 1000 particles per cubic foot per minute. The dominant generation mechanism appears to be a sputtering of the corona tips as disclosed by R. P. Donovan, P. A. Lawless and D. D. Smith in an article entitled "Polarity Dependence of Electrode Erosion Under DC Corona Discharge", Microcontamination, May 1986, pages 38-49. In the process of ionization by use of the corona tips, the corona tips serve to concentrate locally the electric fields to a sufficient intensity for exceeding the ionization threshold of the air.

However, in view of the introduction of particulate matter by the corona tips, there is a loss in effectiveness of the resulting ionized air as a means for discharging the semiconductor and the tool surfaces in the prevention of contamination of the semiconductor chips.

SUMMARY OF THE INVENTION

The aforementioned problem is overcome and other advantages are provided by an ionization of air without the use of corona discharge tips, thereby to avoid the generation of particulates from corrosion of the corona tips. During the manufacture of a semiconductor circuit chip, certain steps such as deposition of a layer on a substrate or impregnation of a layer with a dopant are conducted in a vacuum, while other steps such as photolithography are conducted in an air environment. During those steps which are conducted in an air environment, opportunity exists to employ the invention to remove from the chip charge acquired during the manufacturing process. By way of example, the charges on the chip surface may have been developed by the mechanism of triboelectricity wherein materials used in the manufacture of the chip rub against the surface of the chip.

In accordance with a preferred embodiment of the invention, the air is ionized by a laser beam focussed to a small focal volume of intense electric field adjacent a semiconductor chip, the electric field of the laser beam being sufficiently intense to ionize air. It is noted that laminar flow of air allows the transport of balanced ionized air over a distance, however, the turbulent interior of the stepper precludes such transport. The inventive feature of production of ionized air in-situ, by placing the focal volume of the laser near to the wafer, overcomes the problem of transporting ionized air from a distant source of ionization to the work area. The occasional presence of a laser beam for ionizing the air does not interfere with the movement of mechanical manipulators and other elements of a stepper and, therefore, permits freedom in the use of the stepper. The air may be passed along a surface of the chip for delivery of ions or, due to the proximity of the ion source to the wafer, the ions may be allowed to drift to the charged wafer surface under influence of the electric field of the charged wafer. The electric field of the charged wafer attracts oppositely charged ions for neutralization of the wafer surface which have become charged by steps in a manufacturing process. By way of further embodiment of the invention, the ionization may be produced by injection of molecules of water into the air, which molecules are subsequently ionized by a laser beam and directed toward the chip via a light shield with the aid of a magnetic field, the later aiding in retaining separation of the positive and negative ions during transport from the ion source to the work area.

BRIEF DESCRIPTION OF THE DRAWING

The aforementioned aspects and other features of the invention are explained in the following description, taken in connection with the accompanying drawing wherein.

DETAILED DESCRIPTION

The practice of the invention is based on the fact that intense electric fields can cause breakdown of air in the generation of plasma. The electric fields may be microwave, infrared, optical, ultraviolet, or X-ray, as is disclosed in an article by N. Kroll and K. M. Watson entitled "Theoretical study of Ionization of Air By Intense Laser Pulses", Physical Review A, Vol. 5, 1972, Pages 1883-1905. The phenomena involved are complicated, the precise power needed to cause air to break down depending upon the laser wavelength, the duration of a pulse of the laser radiation, the focal volume in which a laser beam is focused, the density of the gas (such as the air) and its composition, and upon impurities which may be present in the gas.

By way of example in the generation of a suitable beam of laser radiation at 10.6 micron wavelength (far infrared) as is produced by a carbon-dioxide laser, pure air requires an intensity of 10 Joules per square centimeter for laser pulses having a duration shorter than 10 nanoseconds. Ionization of air with substantially longer pulses of the radiation requires an intensity of nearly $10^{10}$ watts per square centimeter. The threshold values of intensity for initiating ionization typically drop for shorter wavelengths of the laser radiation.

Even in the case of a well-focused high-power pulsed single mode diode laser, the foregoing exemplary radiation threshold levels are difficult to achieve. By way of example with respect to the requisite optics, a numerical aperture (NA) of 0.8 with a laser having a 4 micron source (emitting facet of semiconductor laser) and an 11 degree divergence (conic angle of emitted beam) the laser can be focused to approximately 0.6 microns or approximately $3 \times 10^{-9}$ square centimeters. With a peak power of 30 watts in a microsecond pulse, the minimum long pulse breakdown criteria is met for the ionization of air.

There are various techniques which may be employed to reduce the requisite threshold of laser beam intensity sufficiently so as to make practical a laser ionizer. One technique is to preionize the air with charged particles. A second technique is to include aerosol particles in the focal volume. A third technique is to use magnetic fields to protect surfaces of nearby objects, such as a semiconductor chip, from ion bombardment, and to help separate ions of differing charge.

Preionization has been demonstrated to reduce gas breakdown threshold by substantial amounts, as disclosed in an article by R. T. Brown and D. C. Smith, entitled "Laser-Induced Gas breakdown in the Presence of Preionization", Applied Physics Letters, Vol. 22, 1973, pages 245-247. Ion densities in the gas preceding the laser pulse and having a value of approximately $10^{13}$ ions per cubic centimeter lower the thresholds for ionization by carbon-dioxide laser radiation by approximately one order of magnitude. The volume of a focused laser diode spot is approximately $10^{-13}$ cubic centimeters. This volume suggests that several ions in the focal volume will be accelerated by the electric fields of the ionizing radiation to encourage the ions to cascade against other atoms to initiate the breakdown process of air molecules into ions. This effect may be created by a radioactive source near the focal volume, as well as by a pulsed electron beam injector (a vacuum tube with a window for exiting electrons) near the focal volume. In this mode, the laser acts essentially as an ion concentration amplifier.

In a preferred embodiment of the invention, ionization of air is accomplished by use of a Q-switched laser of neodymium yttrium-aluminum-garnet, and will be described below with reference to FIG. 1. The laser outputs coherent radiation which is focused by a lens into a focal region adjacent a wafer employed in the construction of a semiconductor circuit. The intense electromagnetic field of the laser radiation causes initial breakdown or preionization of the air, this leading to intense heat, possibly 10,000 degrees Centigrade, which breaks up molecules of air such as oxygen molecules to produce both positively and negatively charged ions. In the presence of an applied electric field, which may be the field of the charged wafer, the applied field tends to separate the positive and the negative ions. Ions bearing a charge opposite to the charge of the wafer can be brought into contact with the wafer to neutralize the wafer by allowing the ions to drift toward the wafer under the influence of the wafer electric field which attracts ions having the opposite charge of the wafer while repelling ions having the same charge as the wafer. Alternatively, the ions can be brought to the wafer by a flowing of the air past a surface of the wafer. The laser is operated by a flash lamp, energy of the lamp being absorbed in the material of the laser to pump up the electrons to a high energy level. Radiated power in the range of 3-10 megawatts for a duration of a few nanoseconds is produced by the laser. The focal volume has a circular cylindrical shape having a size, typically, with diameter of 10 microns and a length of 50 microns.

In an alternative mode of practice of the invention, ionization of the air is accomplished by introduction of aerosol particles into the focal volume, as will be described below with reference to FIG. 2. As disclosed in an article by D. C. Smith and R. T. Brown, entitled "Aerosol-Induced. Air Breakdown with $CO_2$ Laser Radiation", Journal of Applied Physics, Vol. 46, 1975, Pages 1146–1153, small particles in the focal volume of a carbon dioxide laser cause the breakdown threshold of the air in the focal volume to drop approximately two orders of magnitude to an intensity having a value of $10^8$ water per square centimeter. This change of threshold value appears to be independent of the composition of the aerosol in view of the disclosed use of carbon, clay, aluminum, germanium, and common salts. At the disclosed intensity level, the peak power required of a laser diode would be less than one watt, this being achieved today by commercially available laser diodes. As will be described with reference to FIG. 3, the aerosols will be provided in the alternative embodiment of the invention by use of water droplets produced by a vibrating orifice particle generator operating with highly purified water. The resulting droplets are very small, having a diameter of approximately one-half micron, and are generated periodically and irradiated by the laser to create showers of ions. The utilization of the water as a source of ions is most efficient because, in the absence of evaporative losses of water, a one milliliter sample of water would produce a droplet per second for thousands of years. Therefore, in the alternative embodiment of the invention, a small reservoir incorporated in the ionizer suffices to provide adequate water, there being no need for external plumbing.

It is interesting to note, that with respect to ionizers employing electrodes in the prior art, that the electrodes are sputtered when neutral molecules near the electrodes break apart into ions due to the high fields. Half of the resulting ions must have the opposite charge as the electrodes, and these ions are accelerated towards and impact upon the electrode. The use of a magnetic field can control the direction of movement of the ions, so as to prevent an oppositely charged ion from impacting the electrode. With respect to the alternative embodiment of the invention, the magnetic field can also be used to direct ions in a preferred direction of travel. This is accomplished by placing the magnetic field lines, in the manner of a magnetic mirror, parallel to the surfaces to be protected, and along the direction in which the ions are to travel. The magnetic field interacts with the moving charged particles to direct the particles in a preferred direction, and thereby insulate the surfaces from the slower heavier ions. The magnetic field also tends to break up the ambi-polar diffusion of oppositely charged ions thereby impeding a recombination of the positive and the negative ions.

Figure 1:
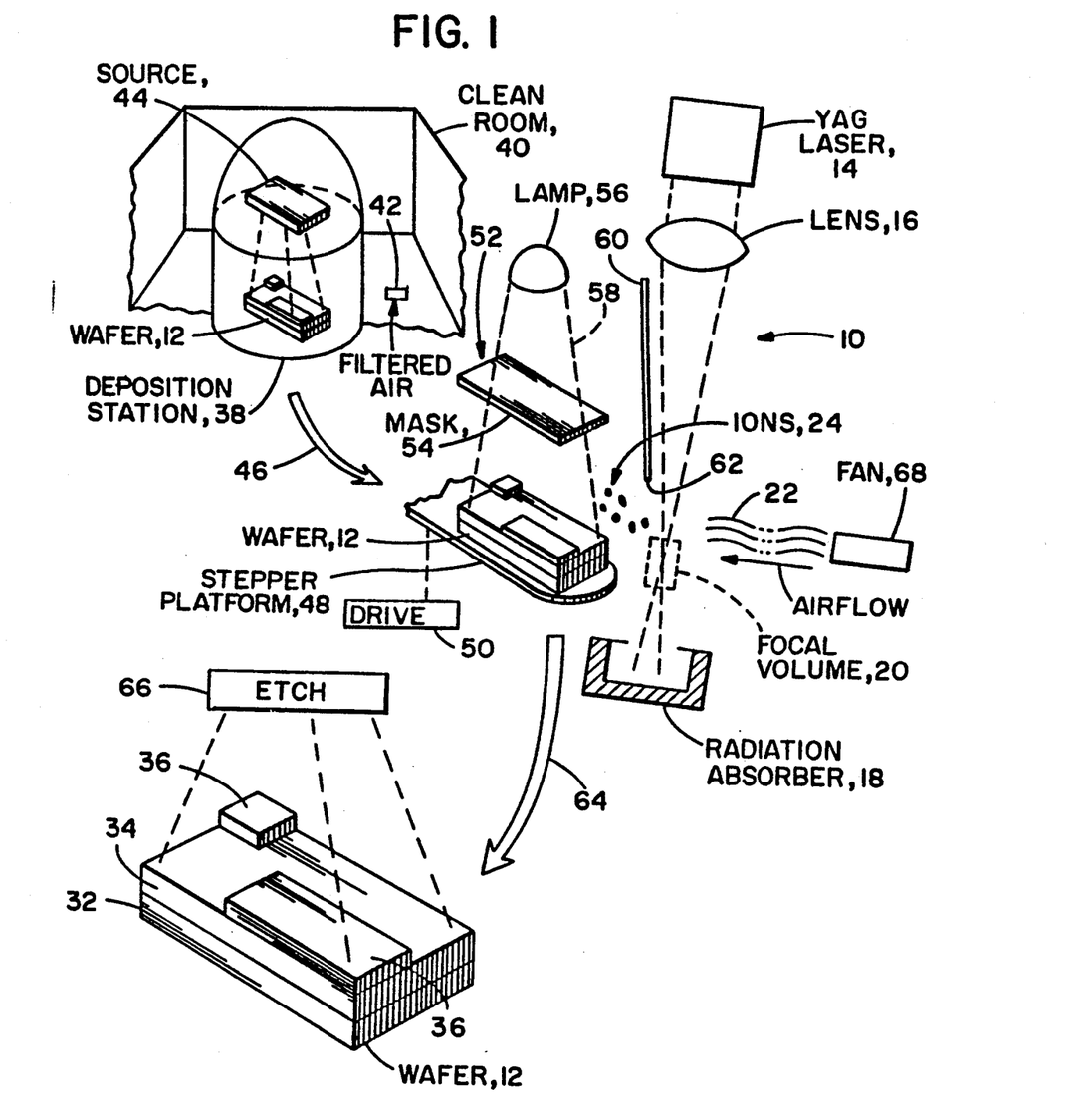
FIG. 1 shows a diagrammatic view of a sequence of steps in a semiconductor chip manufacture including a work station having ionized air produced by a laser beam in an ionization and discharge system constructed in accordance with the invention.

FIG. 1 shows an optical system 10 useful in the practice of the invention for the generation of ionized air for the discharging of a semiconductor wafer 12. The system 10 is useful generally for the ionization of air for neutralization of electric charges found on the surfaces of various objects, including tools useful in the fabrication of semiconductor circuits as well as charges found on the surfaces of layers of material used in the construction of circuitry on a semiconductor wafer, such as the wafer 12. In order to show utility of the system 10 in the manufacture of a semiconductor product, FIG. 1 shows a succession of three stages in the many stages or steps customarily employed in the manufacture of a semiconductor product, particularly the wafer 12 which is to incorporate electronic circuitry upon completion of the manufacture of the wafer 12. Also, by way of example, the three stages ate shown at three different work stations where manufacturing processes are to be performed upon the wafer 12.

The optical system 10 is constructed in accordance with a preferred embodiment of the invention, and includes the aforementioned yttrrium-aluminum garnet (YAG) laser 14 wherein the YAG is doped with neodymium. The laser 14 employs standard constructional features including a flash lamp (not shown) and a Q-switching optical element (not shown) for providing high-intensity short-duration pulses of radiation. The system 10 includes a lens 16 and a radiation absorber 18, the lens 16 lying on an optical path by which the pulses of radiation propagate from the laser 14 to be absorbed within the absorber 18. The lens 16 brings the radiation to a sharp focus within a focal volume 20 wherein the radiation is sufficiently intense to ionize molecules of air 22 to produce ions 24.

Figure 2:
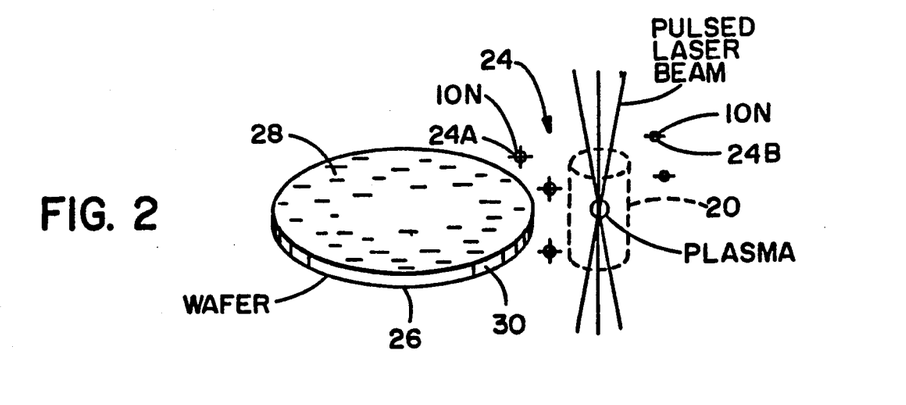
FIG. 2 is a stylized view of a charged wafer receiving ions from plasma of a laser beam.

FIG. 2 shows the generation of the ions 24 in an enlarged stylized view. The intensity of the beam of pulsed laser radiation, within the focal volume 20, is sufficiently intense to produce a plasma containing the ions 24, some of the ions being positive ions 24A and some of the ions being negative ions 24B. The focal volume 20 is located adjacent a wafer 26 shown, by way of example, as a flat disk having an upper surface having regions which are negatively charged. The negatively charged regions attract the positive ions 24A with a resultant discharge of the charged regions and neutralization of the wafer 26. The focus of the laser beam is located at a distance of approximately 2-3 inches from the lens 16 (FIG. 1). The focal volume 20 is spaced apart from the wafer 26 (FIG. 2), or from the wafer 12 (FIG. 1) by a distance of approximately ¼ inch from the wafer surface. The intense temperatures of the plasma, as well as the intense electric field of the laser beam in the focal volume 20 inhibit recombination of the positive ions 24A with the negative ions 24B so that a cloud of the ions 24 can be moved over the wafer surface by a drifting of ions under the influence of the electric field of the wafer. Alternatively, the cloud of ions can be moved over the wafer surface by a flow of the air 22 through the focal volume 20 and along the charged surface of the wafer.

In order to maximize contact of the ion cloud with a top surface 28 of the wafer 26 (FIG. 2), the center of the focal volume 20, this being the location of the focus of the laser beam, is positioned approximately ¼ inch behind the plane of the top surface 28, and ¼ inch from the cylindrical surface of the edge 30 of the wafer 26. Locating the focal volume behind the plane of the top surface 28 is advantageous for shadowing the top surface 28 from ultraviolet radiation which is produced by the plasma in the laser beam. By way of example, the top surface 28 may have photoresist which is not to be exposed to the ultraviolet radiation. The shadowing protects the photoresist from the ultraviolet radiation.

The wafer 12 is shown with a different configuration than that of the wafer 26 to demonstrate that the optical system 10 is operable with objects of different sizes and shapes. Also, the wafer 12 shows plural layers of material, the layers including a substrate 32, a middle layer 34 and a top layer 36. The top layer 36 is divided into a plurality of sections, two of which are shown in FIG. 1, to demonstrate the construction of portions of circuit elements. Typically, in the construction of a plurality of circuit chips on a semiconductor wafer, the thicknesses of the layers, as measured in a direction perpendicular to a plane of the substrate 13, is very small compared to the above-noted spacing of ¼ inch between the focus of the laser beam and the charged surface which is to be neutralized. Therefore, there is no need to reposition the wafer 12 as subsequent layers are added to the wafer in the manufacturing process, which layers are to be neutralized by the ionized air of the optical system 10.

In FIG. 1, in the exemplary use of the optical system 10 in a stage of manufacture of the electrical circuitry of the semiconductor wafer 12, the wafer 12 is shown in a partial stage of completion in a sequence of steps taken from a procedure of many steps employed in the manufacture. In the first step, the wafer 12 is disposed in a deposition station 38 located in a clean room 40. Filtered air enters the clean room 40 via a duct 42 in a floor of the room 40. The station 38 is employed for deposition of layers of material on the wafer 12, and for the application of dopants to the wafer 12. By way of example, FIG. 1 shows a source 44 of photoresist dispensing the photoresist, within the station 38, upon the wafer 12 to coat the surface of the top layer 36 with photoresist.

The manufacturing process proceeds via arrow 46 to a further stage in the manufacturing process wherein the wafer 12 is removed from the deposition station 38 and placed upon a platform 48 of stepper apparatus which includes an electromechanical drive 50 for moving the platform 48 to position the wafer 12 in a photolithographic station 52.

The photolithographic station 52 includes a mask 54, and a lamp 56 which projects light 58 through the mask 54 to expose the photoresist with an image provided by the mask 54. It is to be understood that the term "light" employed in the photolithographic station 52 may include light of the visible spectrum, as well as infrared light, ultraviolet light, and radiation of other portions of the spectrum such as x-radiation. The light 58 exposes the photoresist at those portions of the mask image wherein the light impinges upon the photoresist, thereby to sensitize specific regions of the photoresist to a chemical bath employed in a subsequent etching step.

In accordance with a feature of the invention, triboelectric charges which may have been induced upon the photoresist during the process of deposition of the photoresist in the station 38 are removed by passing the ionized air from the optical system 10 across the surface of the wafer 12 so as to contact the charged regions of the photoresist with the ions 24. This is accomplished, as has been noted above, by locating the wafer 12 adjacent the focal volume 20 of the optical system 10. By way of example, the locating of the wafer 12 can be accomplished by movement of the platform 48 to bring the wafer 12 to a designated position adjacent the focal volume 20. In view of the fact that the photoresist is sensitive to light in a specific range of frequencies, which range of frequencies might include light produced by an ionizing optical system such as the system 10, it may be desirable to include a light shield 60 positioned between the laser beam of the system 10 and the photolithographic station 52 to prevent the possibility of scattered rays of radiation of the laser beam from impinging upon the wafer 12. The ionized air would flow through a passage 62 in the light shield 60.

The manufacturing process then proceeds via arrow 64 to a further stage wherein the wafer 12 is applied with an etchant from a source 66 of etchant which removes regions of photoresist designated by the pattern of exposure of the photolithographic station 52. The wafer 12 is ready now to receive a subsequent layer of material in the deposition station 38. If desired, prior to returning the wafer 12 to the deposition station 38, the wafer 12 may be exposed again to the ionized air of the optical system 10 to neutralize any charge which may have developed by use of the etchant. In general it is presumed during the manufacturing process, that the wafer 12 will be returned numerous times to the location adjacent the focal volume 20 for neutralization of any charges which may have developed during a preceding step of the manufacture.

It is also noted, by way of convenience in the use of the invention, that it is possible to employ a plurality of systems such as the system 10 for neutralizing the wafer 12 at various locations within the manufacturing process. Alternatively, it is possible to move, or reorient, the system 10 to treat the wafer 12 at various locations of the manufacturing process. Also, it should be noted that it may be possible to accomplish a number of the manufacturing steps by retaining the wafer 12 in a fixed location adjacent the focal volume 20 by moving tools, such as the mask 54 to allow deposition of a further material, such as the etchant, in which case the wafer 12 remains in position for receiving the ionized air. It is also understood that the etchant might be applied by dipping the wafer 12 in a bath of etchant (not shown) after which the wafer 12 would be returned to the location adjacent the focal volume 20 for neutralization of charges which may have developed during the etching.

By way of further example in the manufacturing procedure, the wafer 12 may receive a wet rinse, after which the wafer 12 would be placed alongside the focal volume 20 of the system 10 to neutralize any charges which may have occurred in the rinse process. Charges are induced also in other manufacturing procedures such as the sliding of a wafer from one boat to another boat, in which case the charges are to be neutralized by ions from the laser. In general, the presentation of the deposition station 38 in FIG. 1 is intended to represent a variety of manufacturing steps which may result in the formation of electric charges on a surface of the wafer 12, which charges are to be neutralized by conveying the wafer 12 to the location adjacent the focal volume 20. The air used in producing the ionized air is obtained from the filtered air provided by the duct 42 of the clean room 40 to insure freedom of contamination of the wafer 12 during the manufacturing process. With respect to the flow of air 22 through the focal volume 20 towards the wafer 12, the available convection of air present in the clean room 40 may be employed as the source of air flow or, if desired, a fan 68 may be employed to generate the air flow and direct the air flow in the desired direction across the wafer 12.

Figure 3:
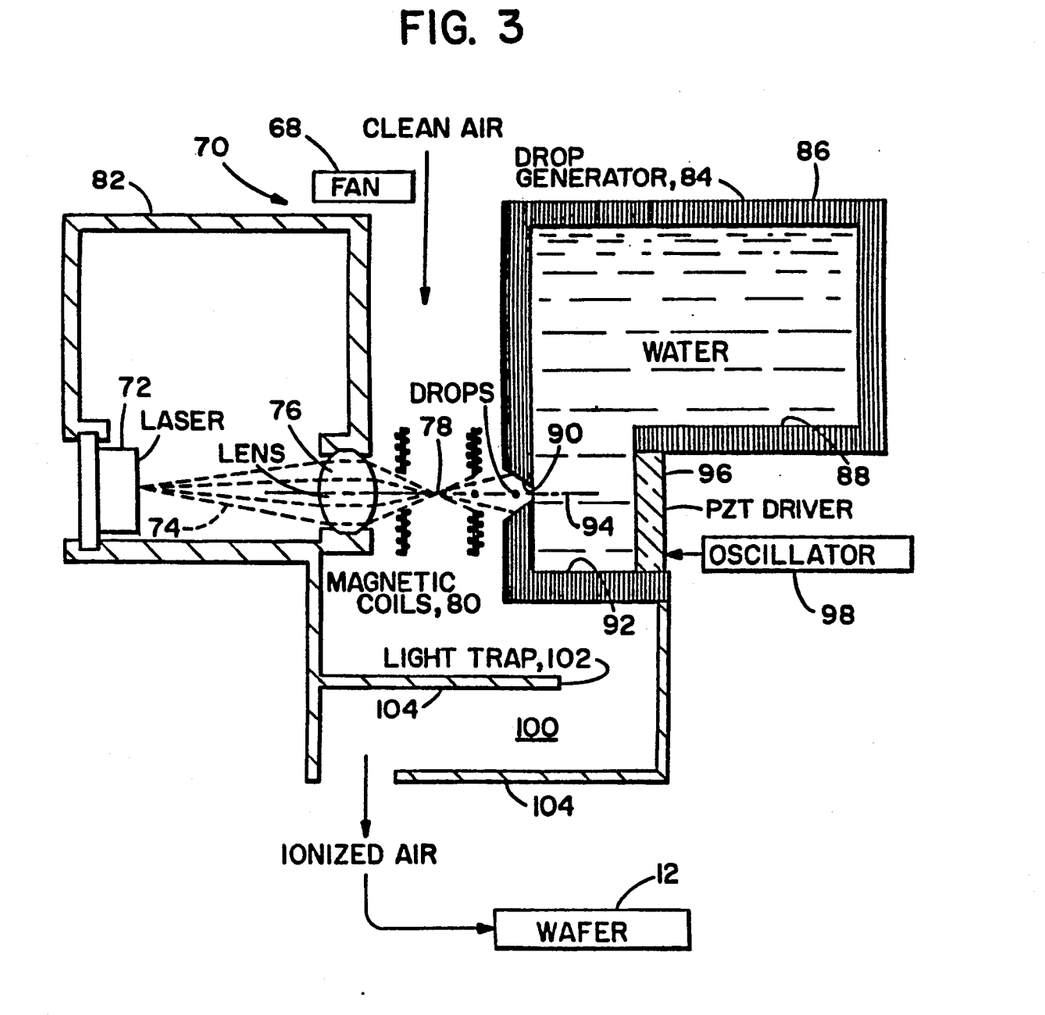
FIG. 3 shows a diagrammatic view of ionization apparatus employing water droplets in accordance with an alternative embodiment of the invention.

FIG. 3 shows a system 70 for ionizing air, the system 70 being an alternative embodiment of the system 10 of FIG. 1. In FIG. 3, the system 70 employs a laser 72 transmitting radiation 74 through a lens 76, the lens 76 focusing the radiation 74 to converge at a focus 78. The system 70 includes magnetic coils 80 which enclose the focus 78, and are activated by current provided by a suitable current source (not shown) to provide a magnetic field directed along an axis of the lens 76. A housing 82 positions the laser 72 and the lens 76 relative to each other and relative to the coils 80.

The system 70 further comprises a drop generator 84 having a housing 86 defining a reservoir 88 for the storage of water. An orifice 90 is provided in a lower chamber 92 of the reservoir 88 for the egress of droplets of water, the orifice 90 being positioned along a common axis of the coils 80. The water reduces the preionization threshold of electromagnetic intensity in the focal volume of the laser beam. Instead of water, other liquid such as alcohol or even a solid material such as dry ice (solid carbon dioxide) pellets may be employed, and the term "drops" is intended to include such other threshold reduction material. The axis 94 coincides with the axis of the lens 76 and passes through the focus 78. An acoustic transducer, such as a PZT (lead-zirconate-titanate ceramic) driver 96, is located in a back wall of the chamber 92 opposite the orifice 90 for inducing vibrations in the water of the reservoir 88. The vibrations of the water result in the generation of minute droplets of water which exit via the orifice 90 to pass through the coils 80 along the axis 94 into the focus 78. An oscillator 98 electrically activates the driver 96 to vibrate at the frequency of oscillation of the oscillator 98.

In operation, the radiation 74 of the laser 72 is concentrated by the lens 76 to a sufficient intensity at the focus 78 to ablate the droplets of water exiting the orifice 90. Ablation of the droplets converts the droplets into charged ions which interact with the magnetic field of the coils 80. Any component of velocity of a charged ion which is normal to the magnetic field produces a force which is perpendicular to both the field and the velocity component resulting in a spiral movement of the ion about the axis 94. Positively and negatively charged ions spiral in opposite directions about the axis 94. This movement of the ions aids in maintaining a separation between positively and negatively charged ions as they propagate through an environment of air in the vicinity of the focus 78.

The ions are carried by an air stream which is guided through a channel 100 formed within a light trap 102. By way of example, the light trap 102 may be formed of metallic vanes 104 extending from the housings 82 and 86. The presence of the ions in the air constitutes ionized air. The fan 68 of the system 10 of FIG. 1 may also be employed in the system 70 of FIG. 3 for blowing air of the clean room 40 through the focus 78 and the channel 100 to pass over the wafer 12. Passage of the ionized air over the surface of the wafer 12 provides for interaction of the ionized air with charged regions of the surface of the wafer 12 for neutralizing the charges as was described above for the manufacturing process of FIG. 1.

While the above description describes the invention in terms of semiconductor manufacturing and processing, the described method and apparatus are equally applicable to the manufacture of reticles, masks, disks and the like requiring charge removal during processing.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A method for generating contamination-free ionized air for discharging an object comprising:
    illuminating a region of the air with radiation;
    concentrating the radiation in a focal volume adjacent the object by directing rays of the radiation along converging paths which bypass the object, the concentrating providing sufficient intensity of radiation to ionize the air;
    locating said focal volume at a side of the object to reduce illumination of a surface of the object by plasma in the focal volume, said step of locating including a locating of said focal volume adjacent an edge of the object to discharge the object by ions borne by the air; and
    flowing the air past the object to bring ions of the ionized air in contact with charged regions on a surface of the object.

2. A method according to claim 1 wherein said step of concentrating the radiation provides for in-situ ionization of the air near the object.

3. A method according to claim 1 wherein said radiation is coherent radiation, and said step of illuminating comprises a step of activating a laser to produce a beam of said coherent radiation, and wherein said object is a semiconductor wafer.

4. A method for generating contamination-free ionized air for discharging an object comprising:
    illuminating a region of the air with radiation;
    concentrating the radiation in a focal volume adjacent the object to provide sufficient intensity of radiation to ionize the air;

flowing the air past the object to bring ions of the ionized air in contact with charged regions on a surface of the object;

locating said focal volume adjacent an edge of the object to discharge the object by ions borne by the air;

wherein said radiation is coherent radiation, and said step of illuminating comprises:

activating a laser to produce a beam of said coherent radiation; and dispensing water molecules into said focal volume to become ionized by said radiation, ionized molecules of the water being carried by the air to provide said ionized air, said object being a semiconductor wafer.

5. A method for generating contamination-free ionized air for discharging an object comprising:

illuminating a region of the air with radiation;

concentrating the radiation in a focal volume adjacent the object to provide sufficient intensity of radiation to ionize the air;

flowing the air past the object to bring ions of the ionized air in contact with charged regions on a surface of the object;

wherein said radiation is coherent radiation, and said step of illuminating comprises:

activating a laser to produce a beam of said coherent radiation; and dispensing drops of a preionization threshold reduction material into said focal volume to become ionized by said radiation, ionized molecules of the water being carried by the air to provide said ionized air.

6. A method according to claim 5 wherein said step of concentrating the radiation provides for in-situ ionization of the air near the object.

7. A method of manufacturing a semiconductor circuit on a chip wherein a structure of the circuit comprises a succession of layers of materials developed upon a substrate of a wafer, the method employing manufacturing steps of photolithography with deposition and etching of layers of material to be performed at different work stations, the method comprising:

positioning said wafer at a work station;

generation ionized air;

contacting a surface of said wafer with the ionized air to discharge said surface;

performing a manufacturing step upon said wafer at the work station; and wherein said generating step comprises the steps of:

illuminating a region of air at said station with radiation;

concentrating the radiation in a focal volume adjacent said wafer by directing rays of the radiation along converging paths which bypass the wafer, the concentrating providing sufficient intensity of radiation to ionize the air; and locating said focal volume at a side of the wafer to reduce illumination of a surface of the wafer by plasma in the focal volume, said step of locating including a locating of said focal volume adjacent an edge of the wafer to discharge the wafer by ions borne by the air.

8. A method according to claim 7 wherein said radiation is coherent radiation, and said step of illuminating comprises a step of activating a laser to produce a beam of said coherent radiation.

9. A method of manufacturing a semiconductor circuit on a chip wherein a structure of the circuit comprises a succession of layers of materials developed upon a substrate of a wafer, the method employing manufacturing steps of photolithography with deposition and etching of layers of material to be performed at different work stations, the method comprising:

positioning said wafer at a work station;

generating ionized air;

contacting a surface of said wafer with the ionized air to discharge said surface;

performing a manufacturing step upon said wafer at the work station; and wherein said generating step comprises steps of:

illuminating a region of air at said station with radiation; and concentrating the radiation in a focal volume adjacent said wafer to provide sufficient intensity of radiation to ionize the air;

said radiation is coherent radiation, and said step of illuminating comprises:

activating a laser to produce a beam of said coherent radiation;

dispensing drops of a preionization threshold reduction material into said focal volume to become ionized by said radiation, ionized drops being entrained in the air to provide said ionized air.

10. A method for generating contamination-free ionized air for discharging an object during a photolithographic process of manufacture of the object, the method comprising:

concentrating coherent radiation optically in a focal volume said concentrating including a converging of rays of radiation to said focal volume;

ionizing air by flowing the air via the focal volume to the object, the flowing of the air via the focal volume allowing the radiation to ionize the air;

locating said focal volume adjacent an edge of the object for in-situ ionization of the air near the object by directing the rays of radiation to pass by the object; and discharging the object with ionized air obtained in said focal volume, said discharging being performed during said process of manufacture.

11. A method for generating contamination-free ionized air for discharging an object during a photolithographic process of manufacture of the object, the process of manufacture including a depositing of photosensitive material on a surface of the object, the method for generating contamination-free ionized air comprising:

concentrating coherent radiation optically in a focal volume said concentrating including a converging of rays of radiation to said focal volume;

ionizing air by flowing the air via the focal volume to the object, the flowing of the air via the focal volume allowing the radiation to ionize the air;

locating said focal volume adjacent an edge of the object for in-situ ionization of the air near the object by directing the rays of radiation to pass by the object, there being a plasma in said focal volume emitting a further radiation;

shielding the photosensitive material on the surface of the object from at least one of said coherent radiation and said further radiation; and discharging the object with ionized air obtained in said focal volume, said discharging being performed during said process of manufacture.

12. A method according to claim 11 wherein said coherent radiation is produced as a beam from a laser, and said shielding from said coherent radiation is accomplished by installing an opaque shield between the laser beam and the photosensitive material on the surface of the object.

13. A method according to claim 11 wherein the surface holding the photosensitive material is planar, and said shielding from said further radiation is accomplished by positioning said focal volume behind a plane of the surface holding the photosensitive material.

14. A method according to claim 12 wherein the surface holding the photosensitive material is planar, and said shielding from said further radiation is accomplished by positioning said focal volume behind a plane of the surface holding the photosensitive material.

15. A method according to claim 14 wherein said locating provides for a locating of said focal volume at a distance of approximately one-eighth inch from the side of the object, and said positioning provides for a positioning of said focal volume at a distance of approximately one-eighth inch behind said plane.

16. A method according to claim 15 wherein said concentrating provides for said focal volume a maximum dimension of approximately 50 microns.